(12) United States Patent
Nishihara

(10) Patent No.: US 11,735,560 B2
(45) Date of Patent: Aug. 22, 2023

(54) ELECTRONIC-COMPONENT-EMBEDDED SUBSTRATE AND METHOD OF MAKING THE SAME

(71) Applicant: SHINKO ELECTRIC INDUSTRIES CO., LTD., Nagano (JP)

(72) Inventor: Yoichi Nishihara, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 157 days.

(21) Appl. No.: 17/303,049

(22) Filed: May 19, 2021

(65) Prior Publication Data
US 2021/0375818 A1 Dec. 2, 2021

(30) Foreign Application Priority Data

May 28, 2020 (JP) ................... 2020-093283

(51) Int. Cl.
*H01L 23/00* (2006.01)
*H01L 23/498* (2006.01)
*H01L 21/48* (2006.01)
*H01L 23/538* (2006.01)
*H01L 23/31* (2006.01)
*H01L 25/065* (2023.01)
(Continued)

(52) U.S. Cl.
CPC .......... *H01L 24/73* (2013.01); *H01L 21/4846* (2013.01); *H01L 23/49866* (2013.01); *H01L 23/5387* (2013.01); *H01L 24/24* (2013.01); *H01L 24/32* (2013.01); *H01L 24/82* (2013.01); *H01L 24/92* (2013.01); *H01L 23/3185* (2013.01); *H01L 25/0655* (2013.01); *H01L 25/16* (2013.01); *H01L 25/18* (2013.01); *H01L 2224/2402* (2013.01); *H01L 2224/245* (2013.01); *H01L 2224/24011* (2013.01); *H01L 2224/24137* (2013.01); *H01L 2224/32105* (2013.01); *H01L 2224/32225* (2013.01); *H01L 2224/73217* (2013.01); *H01L 2224/82101* (2013.01); *H01L 2224/82106* (2013.01); *H01L 2224/92144* (2013.01)

(58) Field of Classification Search
CPC ................. H01L 24/24; H01L 23/5387; H01L 23/49866; H01L 21/4846; H01L 24/73; H01L 23/00
USPC ....................................... 361/751
See application file for complete search history.

(56) References Cited

U.S. PATENT DOCUMENTS

| | | | | |
|---|---|---|---|---|
| 4,843,188 A | * | 6/1989 | Patterson | ............ H01L 23/5385 |
| | | | | 174/50.5 |
| 5,157,589 A | * | 10/1992 | Cole, Jr. | ............ H05K 3/4635 |
| | | | | 361/795 |
| 2017/0033024 A1 | * | 2/2017 | Busche | ................... H01L 23/10 |

(Continued)

FOREIGN PATENT DOCUMENTS

JP H11-102942 4/1999

*Primary Examiner* — Tremesha S Willis
(74) *Attorney, Agent, or Firm* — Ipusa, PLLC

(57) ABSTRACT

An electronic-component-embedded substrate includes a base having flexibility and cavities formed therethrough, electronic components disposed in the cavities, respectively, and interconnects disposed on the base and connected to the electronic components, wherein the interconnects include a metal foil having openings that abut the electronic components, and include a plating layer disposed on the metal foil and connected to the electronic components through the openings.

7 Claims, 9 Drawing Sheets

(51) Int. Cl.
 *H01L 25/16* (2023.01)
 *H01L 25/18* (2023.01)

(56) References Cited

U.S. PATENT DOCUMENTS

2021/0159141 A1\* 5/2021 Sikka ................ H01L 23/49866
2022/0102583 A1\* 3/2022 Baumheinrich ...... H01L 27/156

\* cited by examiner

ELECTRONIC-COMPONENT-EMBEDDED SUBSTRATE AND METHOD OF MAKING THE SAME

CROSS-REFERENCE TO RELATED APPLICATIONS

The present application is based upon and claims the benefit of priority from the prior Japanese Patent Application No. 2020-093283 filed on May 28, 2020, with the Japanese Patent Office, the entire contents of which are incorporated herein by reference.

FIELD

The disclosures herein relate to an electronic-component-embedded substrate and a method of making the same.

BACKGROUND

An electronic device having a semiconductor device mounted on a polyimide tape is known in the art (see Patent Document 1, for example).

In the case of related-art electronic devices, it has been difficult to place electronic components such as semiconductor devices at high density.

It is an object of the present disclosures to provide an electronic-component-embedded substrate containing electronic components placed at high density, and to provide a method of making the same.

RELATED-ART DOCUMENTS

Patent Document

[Patent Document 1] Japanese Patent Laid-open Publication No. 11-102942

SUMMARY

According to an aspect of the embodiment, an electronic-component-embedded substrate includes a base having flexibility and cavities formed therethrough, electronic components disposed in the cavities, respectively, and interconnects disposed on the base and connected to the electronic components, wherein the interconnects include a metal foil having openings that abut the electronic components, and include a plating layer disposed on the metal foil and electrically connected to the electronic components through the openings.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, the embodiments will be described with reference to the accompanying drawings. In the specification and drawings, elements having substantially the same functions or configurations are referred to by the same numerals, and a duplicate description thereof may be omitted.

First Embodiment

A first embodiment will be described. The first embodiment is directed to an electronic-component-embedded substrate.

[Structure of Electronic-Component-Embedded Substrate]

Figure 1:
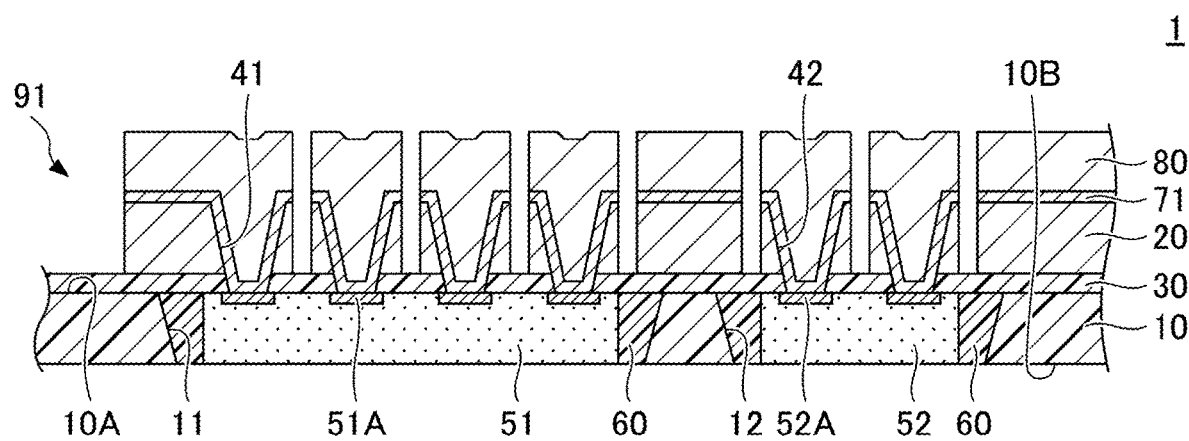
FIG. 1 is a cross-sectional view illustrating the structure of an electronic-component-embedded substrate according to a first embodiment.

In the following, the structure of an electronic-component-embedded substrate will be described first. FIG. 1 is a cross-sectional view illustrating the structure of an electronic-component-embedded substrate according to a first embodiment.

An electronic-component-embedded substrate 1 according to the first embodiment includes a base 10, a first electronic component 51, a second electronic component 52, and interconnects 91, as illustrate in FIG. 1. The base 10 has one surface 10A and the other surface 10B. In the present disclosures, the surface 10A is referred to as an upper surface, and the surface 10B is referred to as a lower surface. The surface 10A may also be referred to as an upper side, and the surface 10B may also be referred to as a lower side. In the present disclosures, the "plan view" refers to a view normal to the surface 10A.

The thickness of the base 10 is greater than or equal to the thickness of the first electronic component 51 and greater than or equal to the thickness of the second electronic component 52, for example. The thickness of the base 10 may alternatively be about the same as the thickness of the thicker of the first electronic component 51 or the second electronic component 52. The thickness of the base 10 is 200 micrometers to 500 micrometers, for example. The base 10 is a polyimide film, for example. The base 10 may include a plurality of polyimide films laminated via an adhesive. For example, when the thickness of the first electronic component 51 or the second electronic component 52, whichever is thicker, is 300 micrometers, the base 10 may have a laminated structure in which a first polyimide film of 50-micrometer thickness, a second polyimide film of 125-micrometer thickness, and a third polyimide film of 125-micrometer thickness are laminated in this order via an adhesive. The adhesive is an epoxy-based adhesive, for example.

The base 10 has a cavity 11 for the first electronic component 51 and a cavity 12 for the second electronic component 52. The cavities 11 and 12 are tapered such that the width of an opening (i.e., aperture diameter) decreases with the distance from the surface 10A of the base 10 toward the surface 10B, for example. For example, the cavities 11 and 12 are each shaped in a frustum of an inverted pyramid with a square base such that the opening diameter of the lower opening end is smaller than the opening diameter of the upper opening end.

The interconnects 91 are disposed on the base 10. The interconnects 91 are attached by an adhesive 30 to the surface 10A of the base 10. The adhesive 30 is a thermosetting epoxy-based adhesive, for example. The thickness of the adhesive 30 is approximately 10 micrometers to 30 micrometers, for example. The interconnects 91 include a metal foil 20, a seed layer 71, and a plating layer 80. The adhesive 30 is disposed between the metal foil 20 and each of the base 10, the first electronic component 51, and the second electronic component 52.

The metal foil 20 contains Cu. The metal foil 20 is a Cu foil, for example. The thickness of the metal foil 20 is approximately 10 micrometers to 100 micrometers, for example. A plurality of via holes 41 abutting (communicating with) the cavity 11 and a plurality of via holes 42 abutting (communicating with) the cavity 12 are formed through the metal foil 20 and the adhesive 30. The via holes 41 and 42 are tapered such that the width of an opening (i.e., aperture diameter) decreases with the distance from the top of the metal foil 20 toward the bottom of the adhesive 30, for example. For example, the via holes 41 and 42 are each shaped in a frustum of an inverted circular cone such that the opening diameter of the lower opening end is smaller than the opening diameter of the upper opening end. The opening diameter of the upper opening end of the via holes 41 and 42 is approximately 150 micrometers to 1000 micrometers, for example. The via holes 41 and 42 are examples of openings.

The first electronic component 51 has a plurality of connection terminals 51A on one surface thereof, and is disposed inside the cavity 11. The surface of the first electronic component 51 on which the connection terminals 51A are disposed is fixedly attached to the adhesive 30 such that the connection terminals 51A are aligned with the respective via holes 41 in a plan view. The connection terminals 51A are situated at the bottom of the via holes 41. The connection terminals 51A contain Al, for example. The first electronic component 51 is an example of an electronic component.

The second electronic component 52 has a plurality of connection terminals 52A on one surface thereof, and is disposed inside the cavity 12. The surface of the second electronic component 52 on which the connection terminals 52A are disposed is fixedly attached to the adhesive 30 such that the connection terminals 52A are aligned with the respective via holes 42 in a plan view. The connection terminals 52A are situated at the bottom of the via holes 42. The connection terminals 52A contain Al, for example. The second electronic component 52 is an example of an electronic component.

The first electronic component 51 and the second electronic component 52 may implemented as active components such as semiconductor chips, transistors, or diodes, or may be implemented as passive components such as chip capacitors, chip inductors, or chip resistors, for example.

The first electronic component 51 and the second electronic component 52 may be implemented as silicon components or ceramic components, for example. The first electronic component 51 and the second electronic component 52 of the present embodiment are semiconductor chips. Examples of the semiconductor chips include logic chips such as a CPU (central processing unit) chip and a GPU (graphics processing unit) chip. Further examples of the semiconductor chips include memory chips such as a DRAM (dynamic random access memory) chip, a SRAM (static random access memory) chip, and a flash memory chip.

The seed layer 71 contains Ti. The seed layer 71 is a Ti layer, for example. The seed layer 71 is formed on the upper surface of the metal foil 20, the sidewalls of the via holes 41 and 42, and the surfaces of the connection terminals 51A and 52A situated at the bottom of the via holes 41 and 42.

The plating layer 80 contains Cu. The plating layer 80 is a Cu layer, for example. The plating layer 80 is formed on the seed layer 71. The thickness of the plating layer 80 is approximately 30 micrometers to 50 micrometers, for example.

Some of the interconnects 91 are connected to the first electronic component 51, and others are connected to the second electronic component 52.

The gap around the first electronic component 51 in the cavity 11 and the gap around the second electronic component 52 in the cavity 12 are filled with sealing resin 60. The sealing resin 60 is a thermosetting epoxy-based resin, for example.

In the first embodiment, the first electronic component 51 and the second electronic component 52 are disposed inside the cavity 11 and the cavity 12, respectively, which are formed through the base 10, with the interconnects formed on the base 10. This arrangement allows the first electronic component 51 and the second electronic component 52 to be disposed at high density, and is thus suitable for size reduction. Moreover, if the first electronic component 51 and the second electronic component 52 were disposed on top of the base 10, surface irregularities occur due to the presence of the first electronic component 51 and the second electronic component 52. The first embodiment serves to reduce such irregularities, thereby providing high flatness.

[Method of Making Electronic-Component-Embedded Substrate]

In the following, a method of making the electronic-component-embedded substrate 1 will be described. FIGS. 2A-2C through FIGS. 6A and 6B are cross-sectional views illustrating the method of making the electronic-component-embedded substrate according to the first embodiment.

Figure 2A:
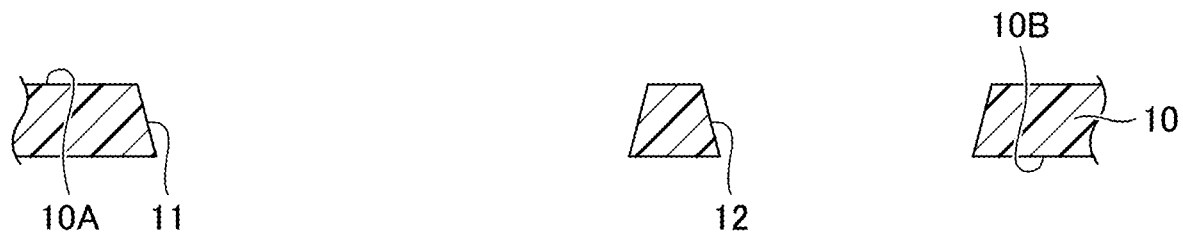
FIGS. 2A through 2C are cross-sectional views illustrating the method of making the electronic-component-embedded substrate according to the first embodiment.

As illustrated in FIG. 2A, the base 10 is provided, and the cavity 11 for the first electronic component 51 and the cavity 12 for the second electronic component 52 are formed therethrough. The cavities 11 and 12 may be formed by a punching process or a stamping process, for example. The cavities 11 and 12 are formed in a tapered shape such that the width of an opening (i.e., aperture diameter) decreases with the distance from the one surface 10A of the base 10 toward the other surface 10B, for example.

Figure 2B:
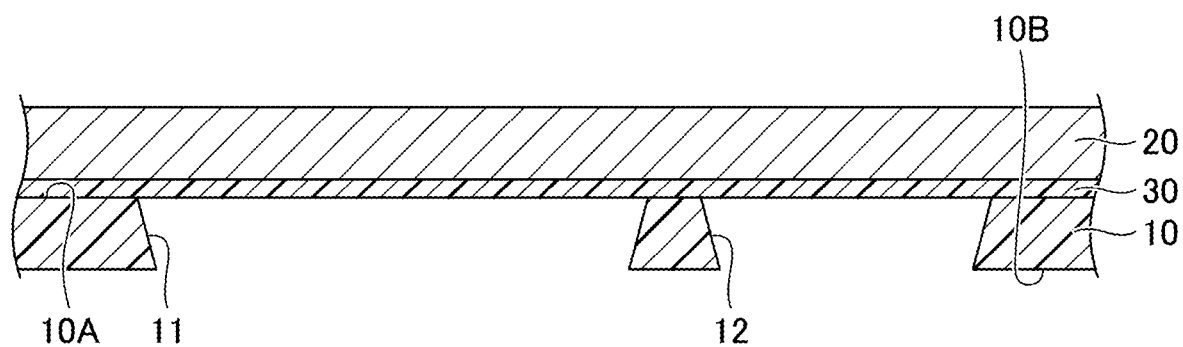

As illustrated in FIG. 2B, the metal foil 20 having the adhesive 30 on one side thereof is pasted on the base 10 such that the adhesive 30 is in contact with the base 10. In so doing, the adhesive 30 and the metal foil 20 are pasted on the surface 10A of the base 10. The metal foil 20, which contains Cu, is a Cu foil, for example. The adhesive 30 is a thermosetting adhesive, for example.

Figure 2C:
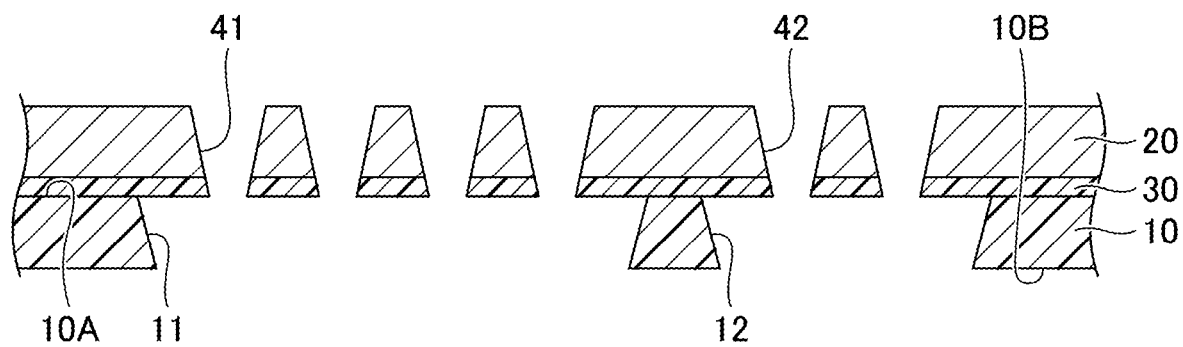

As illustrated in FIG. 2C, the plurality of via holes 41 abutting (communicating with) the cavity 11 and the plurality of via holes 42 abutting (communicating with) the cavity 12 are formed through the metal foil 20 and the adhesive 30. The via holes 41 and 42 may be formed by a punching process or a stamping process, for example. The via holes 41 and 42 are formed in a tapered shape such that the width of an opening (i.e., aperture diameter) decreases with the distance from the top of the metal foil 20 toward the bottom of the adhesive 30, for example.

Figure 3A:
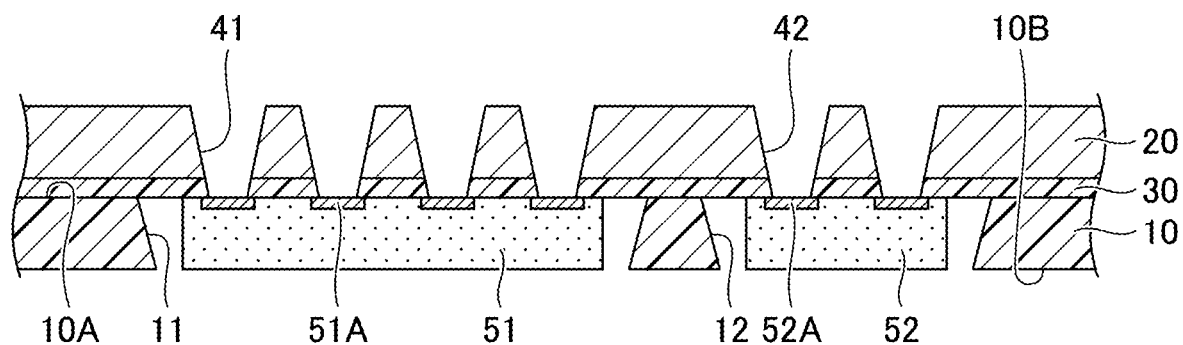
FIGS. 3A through 3C are cross-sectional views illustrating the method of making the electronic-component-embedded substrate according to the first embodiment.

Subsequently, as illustrated in FIG. 3A, the first electronic component 51 having the plurality of connection terminals 51A on one side thereof is disposed inside the cavity 11 by use of a mounter such that the connection terminals 51A are aligned with the respective via holes 41 in a plan view. In so doing, the surface of the first electronic component 51 on which the connection terminals 51A are disposed is brought in contact with the adhesive 30. The connection terminals 51A are exposed at the bottom of the via holes 41. Further, the second electronic component 52 having the plurality of connection terminals 52A on one side thereof is disposed inside the cavity 12 by use of a mounter such that the connection terminals 52A are aligned with the respective via holes 42 in a plan view. In so doing, the surface of the second electronic component 52 on which the connection terminals 52A are disposed is brought in contact with the adhesive 30. The connection terminals 52A are exposed at the bottom of the via holes 42. The connection terminals 51A and 52A contain Al, for example.

Figure 3B:
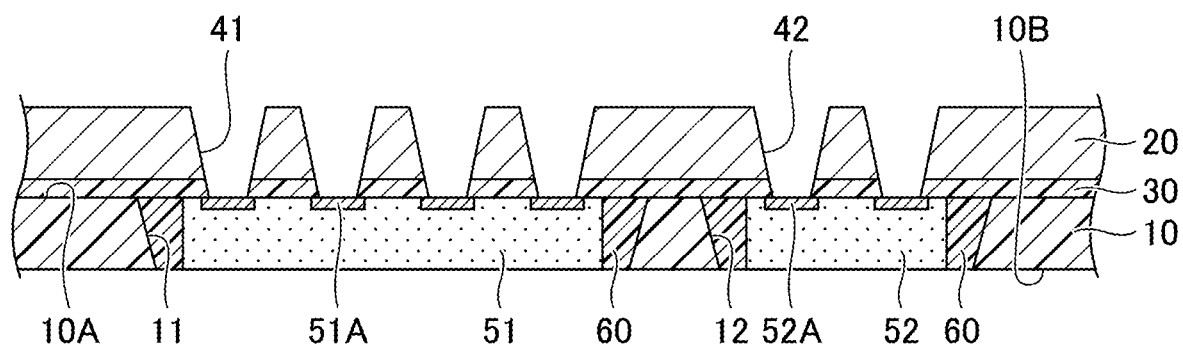

As illustrated in FIG. 3B, the gap around the first electronic component 51 in the cavity 11 and the gap around the second electronic component 52 in the cavity 12 are filled with the sealing resin 60. The sealing resin 60 is a thermosetting resin, for example. Thereafter, heat treatment is applied to cure the sealing resin 60 and the adhesive 30.

Figure 3C:
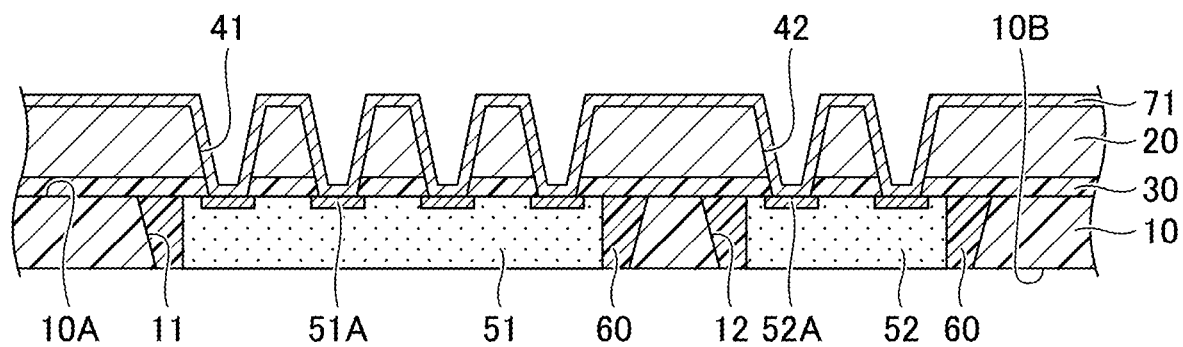

As illustrated in FIG. 3C, the seed layer 71 containing Ti is formed on the upper surface of the metal foil 20, the sidewalls of the via holes 41 and 42, and the surfaces of the connection terminals 51A and 52A exposed in the via holes 41 and 42. The seed layer 71 may be formed by sputtering, for example. The seed layer 71 is a Ti layer, for example.

Figure 4A:
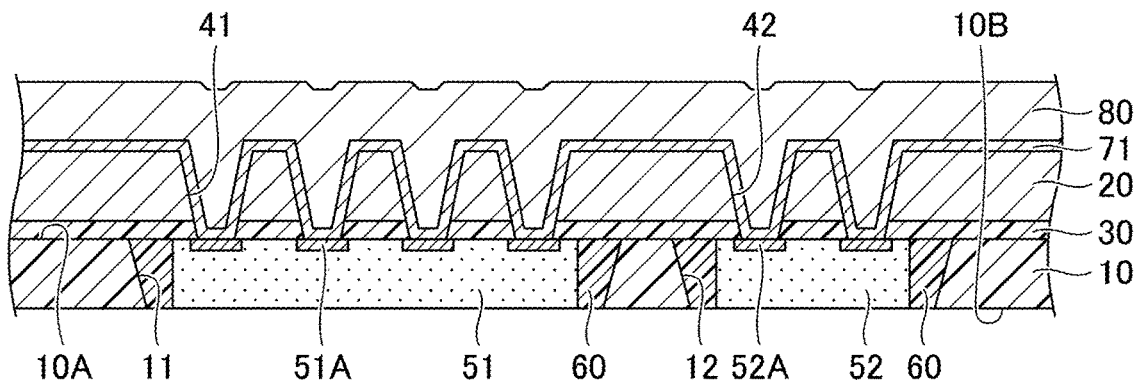
FIGS. 4A through 4C are cross-sectional views illustrating the method of making the electronic-component-embedded substrate according to the first embodiment.

Subsequently, as illustrated in FIG. 4A, the plating layer 80 containing Cu is formed on the seed layer 71 by an electrolytic plating method utilizing the seed layer 71 as a feeding path for plating. The plating layer 80 is a Cu layer, for example.

Figure 4B:
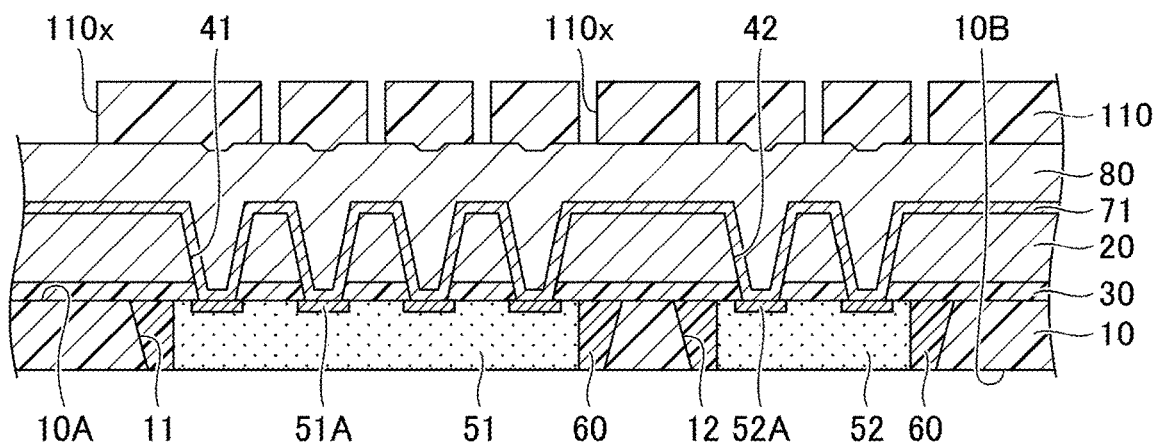

As illustrated in FIG. 4B, a resist layer 110 having openings 110x is formed on the plating layer 80. The openings 110x are provided in the areas other than the areas where the interconnects 91 are to be formed, for example. The material of the resist layer 110 is, for example, a dry film resist or a liquid resist.

Figure 4C:
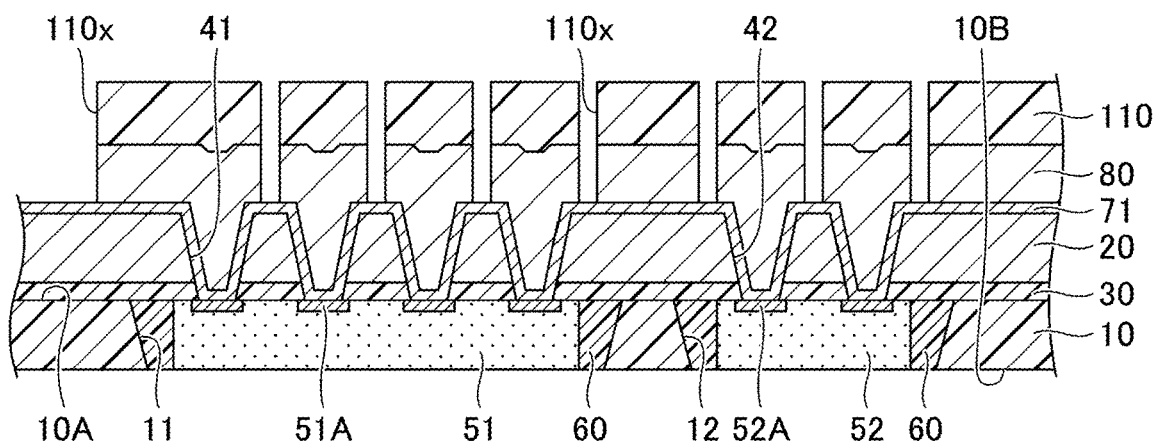

As illustrated in FIG. 4C, the resist layer 110 is used as a mask to etch and remove the plating layer 80. As a result, the upper surface of the seed layer 71 is exposed.

Figure 5A:
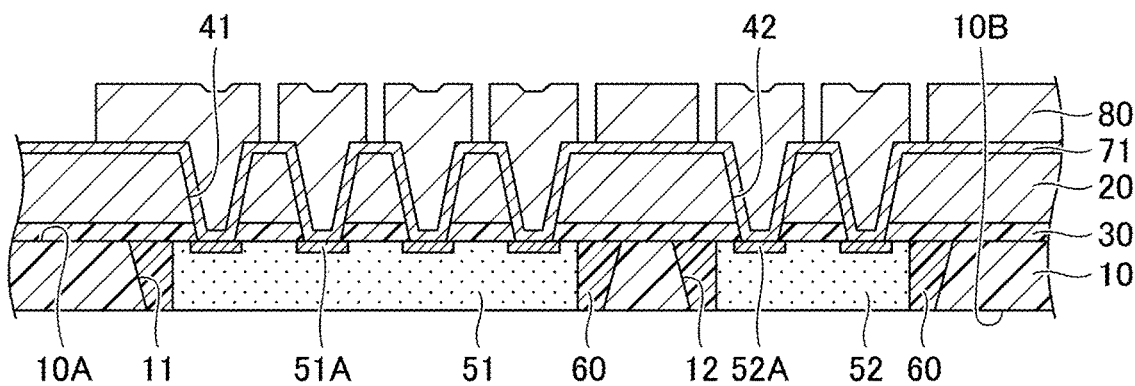
FIGS. 5A through 5C are cross-sectional views illustrating the method of making the electronic-component-embedded substrate according to the first embodiment.

Thereafter, as illustrated in FIG. 5A, the resist layer 110 is removed.

Figure 5B:
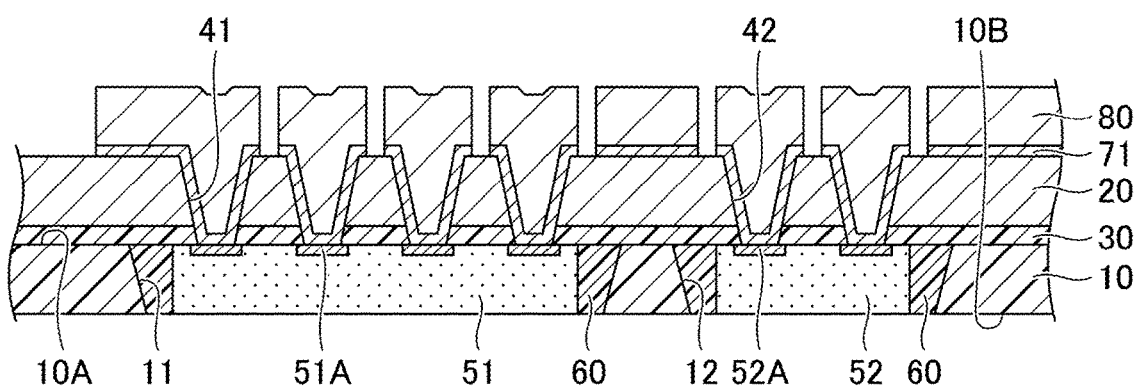

As illustrated in FIG. 5B, the plating layer 80 is used as a mask to etch and remove the seed layer 71. The seed layer 71 containing Ti may be removed by using, for example, an aqueous solution of potassium hydroxide (KOH).

Figure 5C:
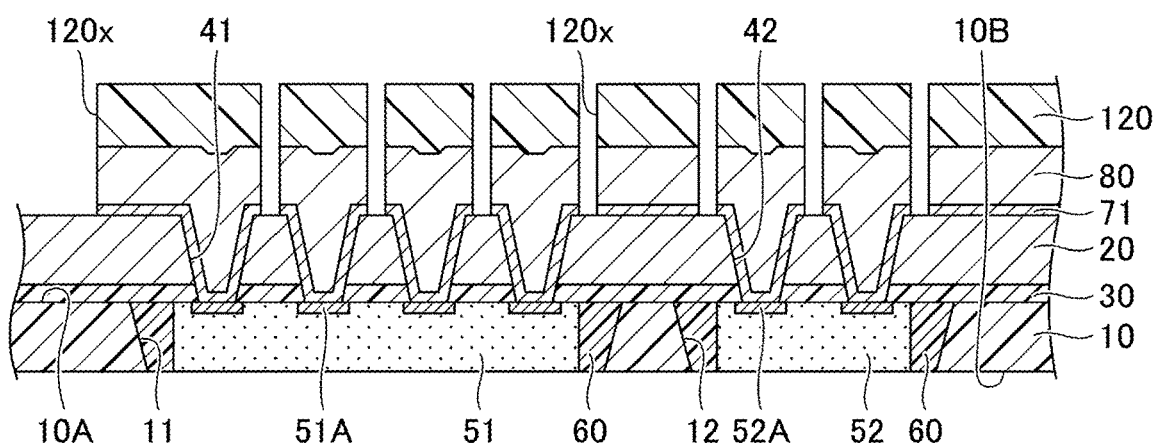

As illustrated in FIG. 5C, a resist layer 120 having openings 120x is formed on the plating layer 80. The openings 120x are provided in the areas other than the areas where the interconnects 91 are to be formed, for example. The material of the resist layer 120 is, for example, a dry film resist or a liquid resist.

Figure 6A:
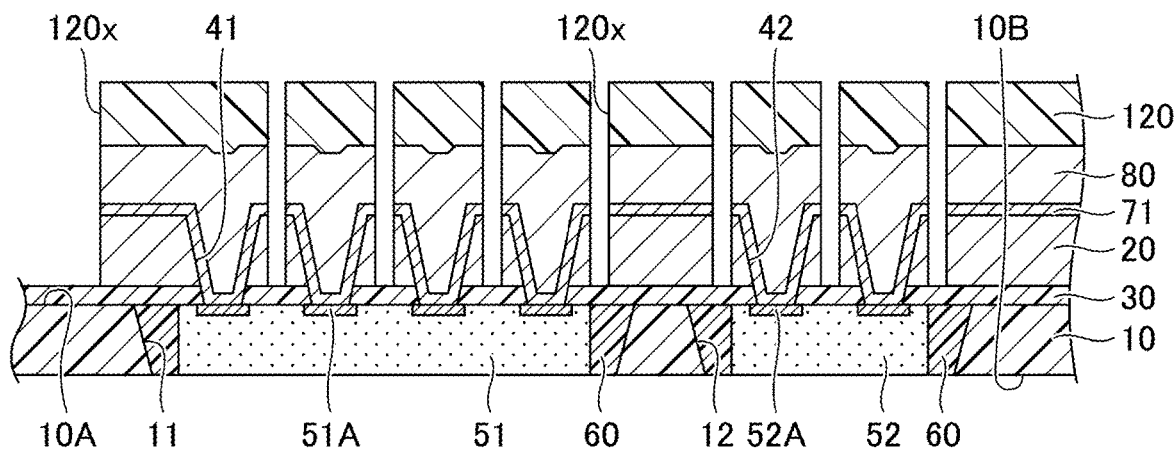
FIGS. 6A and 6B are cross-sectional views illustrating the method of making the electronic-component-embedded substrate according to the first embodiment.

Subsequently, as illustrated in FIG. 6A, the resist layer 120 is used as a mask to etch and remove the metal foil 20. As a result, the upper surface of the adhesive 30 is exposed.

Figure 6B:
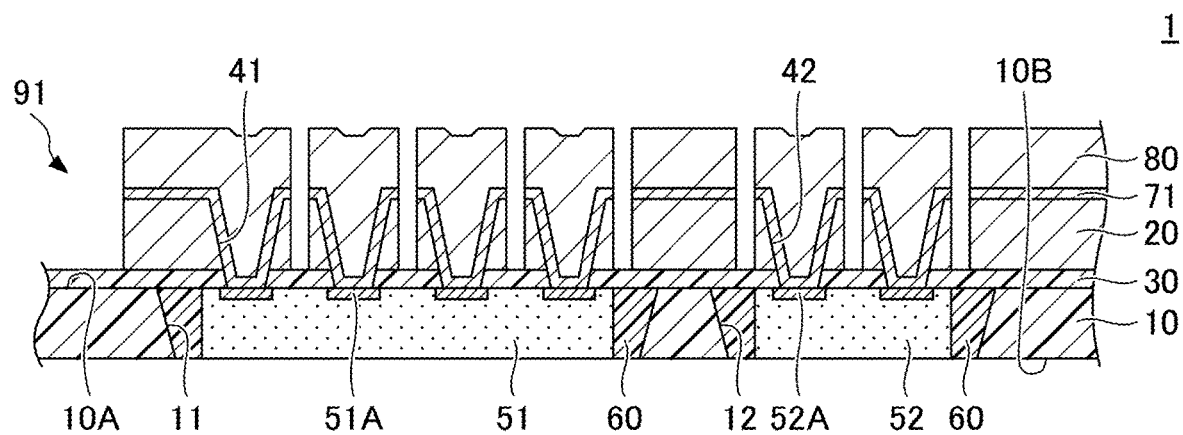

As illustrated in FIG. 6B, the resist layer 120 is removed.

In this manner, the electronic-component-embedded substrate 1 is completed in final form.

Second Embodiment

A second embodiment will be described. The second embodiment primarily differs from the first embodiment in the material of a seed layer.

[Structure of Electronic-Component-Embedded Substrate]

Figure 7:
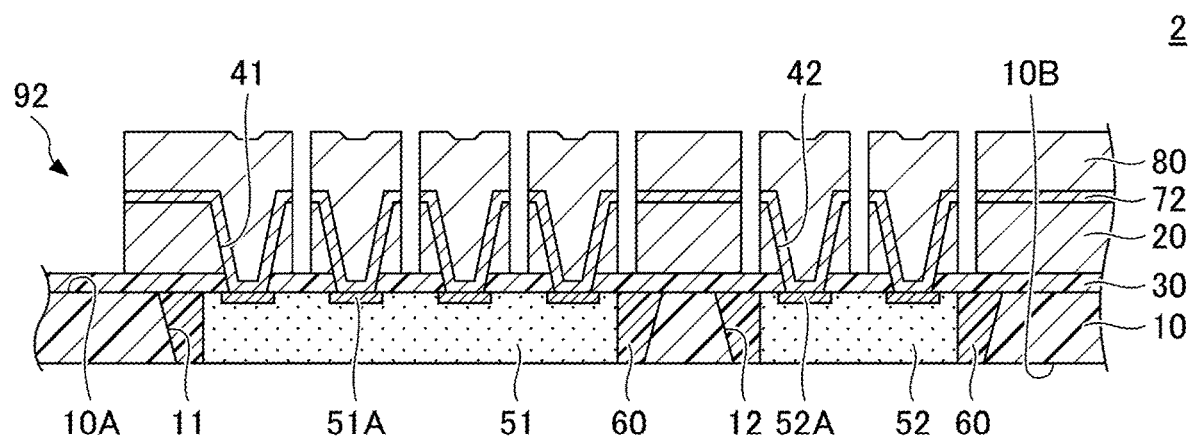
FIG. 7 is a cross-sectional view illustrating the structure of an electronic-component-embedded substrate according to a second embodiment.

In the following, the structure of an electronic-component-embedded substrate will be described first. FIG. 7 is a cross-sectional view illustrating the structure of an electronic-component-embedded substrate according to the second embodiment.

As illustrated in FIG. 7, the electronic-component-embedded substrate 2 according to the second embodiment includes interconnects 92 in place of the interconnects 91 in the electronic-component-embedded substrate 1 according to the first embodiment. The interconnects 92 have a seed layer 72 in place of the seed layer 71. The seed layer 72 contains Cu. The seed layer 72 is a Cu layer, for example. The connection terminals 51A and 52A may include Cu.

The remaining configurations are substantially the same as the configurations of the first embodiment.

[Method of Making Electronic-Component-Embedded Substrate]

In the following, a method of making the electronic-component-embedded substrate 2 will be described. FIGS. 8A-8C and FIGS. 9A and 9B are cross-sectional views illustrating the method of making the electronic-component-embedded substrate according to the second embodiment.

Figure 8A:
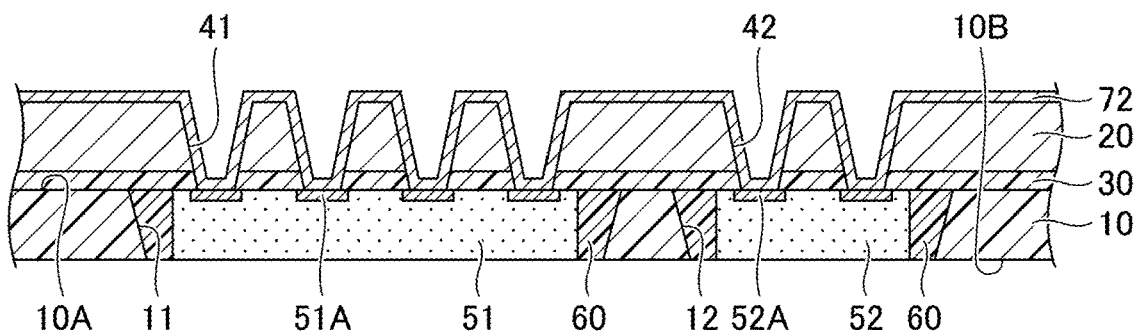
FIGS. 8A through 8C are cross-sectional views illustrating the method of making the electronic-component-embedded substrate according to the second embodiment.

In substantially the same manner as in the first embodiment, the processes up to the heat treatment to cure the sealing resin 60 and the adhesive 30 are performed (see FIG. 3B). Then, as illustrated in FIG. 8A, the seed layer 72 containing Cu is formed on the upper surface of the metal foil 20, the sidewalls of the via holes 41 and 42, and the surfaces of the connection terminals 51A and 52A exposed in the via holes 41 and 42. The seed layer 72 may be formed by use of an electroless plating method, for example. The seed layer 72 is a Cu layer, for example.

Figure 8B:
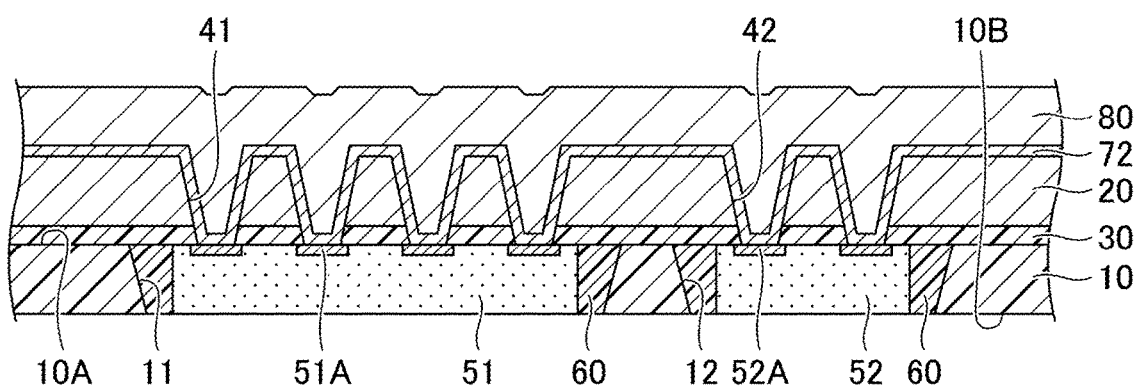

As illustrated in FIG. 8B, the plating layer 80 containing Cu is formed on the seed layer 72 by an electrolytic plating method utilizing the seed layer 72 as a feeding path for plating.

Figure 8C:
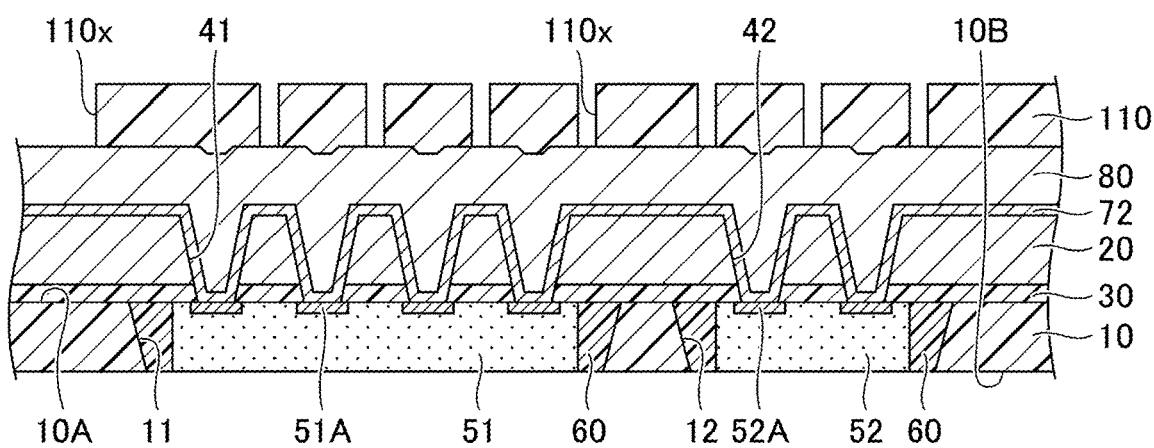

As illustrated in FIG. 8C, a resist layer 110 having openings 110x is formed on the plating layer 80. The openings 110x are provided in the areas other than the areas where the interconnects 92 are to be formed, for example. The material of the resist layer 110 is, for example, a dry film resist or a liquid resist.

Figure 9A:
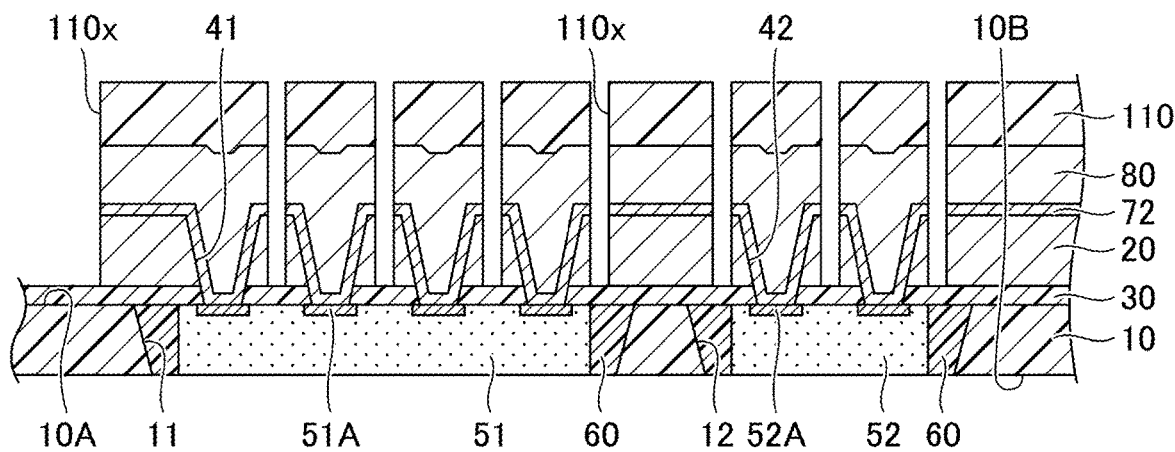
FIGS. 9A and 9B are cross-sectional views illustrating the method of making the electronic-component-embedded substrate according to the second embodiment.

Subsequently, as illustrated in FIG. 9A, the resist layer 110 is used as a mask to etch and remove the plating layer 80, the seed layer 72, and the metal foil 20. As a result, the upper surface of the adhesive 30 is exposed.

Figure 9B:
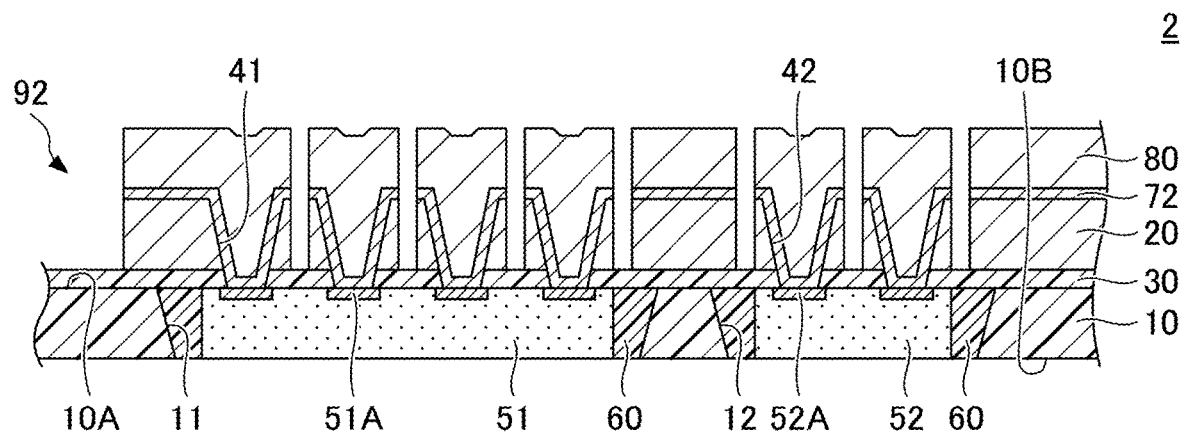

Then, as illustrated in FIG. 9B, the resist layer 110 is removed.

In this manner, the electronic-component-embedded substrate 2 is completed in final form.

The second embodiment brings about substantially the same advantages as those of the first embodiment. Since the seed layer 72 contains Cu, the plating layer 80, the seed layer 72, and the metal foil 20 can all be etched together. Manufacturing can thus be completed in fewer steps.

Although a description has been given with respect to preferred embodiments and the like, the present invention is not limited to these embodiments and the like, but various variations and modifications may be made to these embodiments and the like without departing from the scope of the present invention.

According to the present disclosures, electronic components are placed at high density.

The present disclosures non-exhaustively include the subject matter set out in the following clause:

[Clause 1] A method of making an electronic-component-embedded substrate, comprising:

forming cavities through a base having flexibility;

pasting a metal foil to the base;

forming openings through the metal foil;

placing electronic components in the cavities, respectively, such that the openings abut the electronic components; and forming a plating layer disposed on the metal foil and electrically connected to the electronic components through the openings.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An electronic-component-embedded substrate, comprising:

a base having flexibility and cavities formed therethrough;

electronic components disposed in the cavities, respectively; and interconnects disposed on the base and connected to the electronic components, wherein the interconnects include a metal foil having openings that abut the electronic components, and include a plating layer disposed on the metal foil and electrically connected to the electronic components through the openings.

2. The electronic-component-embedded substrate as claimed in claim 1, wherein the metal foil contains Cu.

3. The electronic-component-embedded substrate as claimed in claim 1, wherein the plating layer contains Cu.

4. The electronic-component-embedded substrate as claimed in claim 1, further comprising a seed layer disposed between the metal foil and the plating layer.

5. The electronic-component-embedded substrate as claimed in claim 4, wherein the seed layer contains Ti or Cu.

6. The electronic-component-embedded substrate as claimed in claim 1, wherein a thickness of the metal foil is 10 micrometers to 100 micrometers.

7. The electronic-component-embedded substrate as claimed in claim 1, further comprising an adhesive disposed between the metal foil and each of the base and the electronic components.

* * * * *